(12) United States Patent
Scandiuzzo et al.

(10) Patent No.: US 9,219,481 B2
(45) Date of Patent: Dec. 22, 2015

(54) CAPACITIVE COUPLING, ASYNCHRONOUS ELECTRONIC LEVEL SHIFTER CIRCUIT

(71) Applicant: STMICROELECTRONICS S.R.L., Agrate Brianza (IT)

(72) Inventors: Mauro Scandiuzzo, Torrazza di Cambiago (IT); Salvatore Valerio Cani, Campobello di Licata (IT); Claudio Mucci, Bologna (IT); Roberto Canegallo, Rimini (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/615,915

(22) Filed: Feb. 6, 2015

(65) Prior Publication Data

US 2015/0155874 A1 Jun. 4, 2015

Related U.S. Application Data

(63) Continuation of application No. 13/753,390, filed on Jan. 29, 2013, now Pat. No. 8,981,830.

(30) Foreign Application Priority Data

Jan. 30, 2012 (IT) .............................. TO2012A0074

(51) Int. Cl.
*H03L 5/00* (2006.01)
*H03K 19/0185* (2006.01)
*H03K 17/16* (2006.01)

(52) U.S. Cl.
CPC ........ *H03K 19/018507* (2013.01); *H03K 17/16* (2013.01); *H03K 19/018521* (2013.01); *Y10T 29/49155* (2015.01)

(58) Field of Classification Search
CPC .................... H03K 19/018507; H03K 17/16
USPC .................. 333/306, 333; 326/80–81, 61–62; 327/306, 333
See application file for complete search history.

(56) References Cited

U.S. PATENT DOCUMENTS

| | | |
|---|---|---|
| 4,794,283 A | 12/1988 | Allen et al. |
| 5,053,993 A | 10/1991 | Miura |

(Continued)

FOREIGN PATENT DOCUMENTS

JP  2006203503 A  8/2006

OTHER PUBLICATIONS

Duchene et al., "A Highly Flexible Sea-of-Gates Structure for Digital and Analog Applications," IEEE Journal of Solid-State Circuits 24(3):576-584, Jun. 1989.

(Continued)

*Primary Examiner* — Dinh Le
(74) *Attorney, Agent, or Firm* — Seed IP Law Group PLLC

(57) ABSTRACT

An asynchronous level shifter electronic circuit including: a transmitter, which can be coupled to a first voltage and generates a communication signal; a receiver, which can be coupled to a second voltage; and a capacitive coupling stage, which receives the communication signal and supplies a corresponding filtered signal to the receiver. The receiver includes: a threshold device, which has an input terminal and an output terminal and switches an electrical quantity on the output terminal between a first value and a second value, as a function of corresponding transitions through a threshold of a first intermediate signal present on the input terminal, to generate a second intermediate signal; and a biasing circuit, which generates the first intermediate signal to have a d.c. component, which is a function of the second intermediate signal, and superposed on which is a variable component, which is a function of the filtered signal.

15 Claims, 3 Drawing Sheets

(56) References Cited

U.S. PATENT DOCUMENTS

| | | |
|---|---|---|
| 7,245,152 B2 | 7/2007 | Wich |
| 7,446,566 B1 | 11/2008 | Chrudimsky |
| 7,777,549 B2 | 8/2010 | Harada |
| 7,835,200 B2 | 11/2010 | Zhang |
| 7,965,107 B2 | 6/2011 | Ciccarelli et al. |
| 8,981,830 B2 * | 3/2015 | Scandiuzzo et al. .......... 327/333 |
| 8,988,128 B2 * | 3/2015 | Fang et al. ................... 327/333 |
| 2008/0088353 A1 | 4/2008 | Kuo |
| 2008/0225987 A1 | 9/2008 | Fazzi et al. |
| 2011/0171906 A1 | 7/2011 | Canegallo et al. |
| 2011/0205028 A1 * | 8/2011 | Pagani et al. ................ 340/10.1 |

OTHER PUBLICATIONS

Scandiuzzo et al., "Input/Output Pad for Direct Contact and Contactless Testing," 2011 Sixteenth IEEE European Test Symposium, May 2011, pp. 135-140.

* cited by examiner

CAPACITIVE COUPLING, ASYNCHRONOUS ELECTRONIC LEVEL SHIFTER CIRCUIT

BACKGROUND

1. Technical Field

The present disclosure relates to a capacitive coupling, asynchronous electronic level shifter circuit.

2. Description of the Related Art

As is known, today it is possible for an integrated circuit, formed on a respective die, to present two or more voltage domains. In other words, it is possible, for two or more regions, also known as "wells", to be formed inside the die, which share one and the same substrate of semiconductor material, and formed inside which are respective electronic circuitries. Moreover, each region can be electrically connected to a respective supply voltage and to a respective ground, the supply voltages and/or the grounds of different regions differing from one another.

In practice, assuming for simplicity the presence, within the integrated circuit, of a first region and a second region, which house, respectively, a first electronic circuitry and a second electronic circuitry, it happens that these first and second electronic circuitries are electrically coupled in such a way to be able to transmit to one another signals of a digital or analog type.

In greater detail, assuming for simplicity that the first and second regions share one and the same ground and that they are, respectively, connected to a first supply voltage VDDA and a second supply voltage VDDB, different from one another, the first and second supply voltages VDDA, VDDB define, respectively, a first voltage domain and a second voltage domain, which in turn affect the dynamics of the signals generated within the first and second circuitries.

Assuming that the first electronic circuitry transmits a communication signal to the second electronic circuitry, it may happen that the dynamics of the communication signal, i.e., the difference between the maximum value and the minimum value of the voltage of the communication signal, does not enable a correct reception thereof by the second electronic circuitry. For example, with reference to a communication signal of a digital type, it is possible for a transition from a voltage level associated to a bit "0" to a voltage level associated to a bit "1" not to be sufficient to enable correct interpretation of the bit "1" by the second electronic circuitry, i.e., not to be sufficient to cause a switching of the latter.

In order to adapt the dynamics of the signals, it is known to resort to so-called "level shifters".

It is hence known to provide a level shifter between two regions connected to different voltage domains. In addition, level shifters are used not only for communications between different regions of one and the same integrated circuit, but also, for example, within the so-called "input/output (I/O) stages", which are formed by input/output electronic circuits connected to conductive pads, which are to receive electrical signals coming from the outside world. Each input/output electronic circuit implements a corresponding level shifter in such a way as to enable adaptation of the signals coming from the outside world, such as, for example, electrical signals coming from a board, as a function of the voltage domain of the region that houses the input/output electronic circuit and the corresponding conductive pad. In this way, the integrated circuit can communicate with the outside world in a unidirectional or bidirectional way.

If we refer to the case of the level shifter between two different regions of one and the same integrated circuit as the so-called "two-dimensional or 2D case", it is moreover known to resort to level shifters to enable communication between two different integrated circuits of an electronic device, the latter case being also known as "three-dimensional or 3D case". In particular, the two different integrated circuits are formed within corresponding pads, which form the electronic device.

Purely by way of example, U.S. Pat. Nos. 7,245,152, 7,835, 200, and 7,446,566 describe level shifters formed by using transistors, and in particular by using transistors of a metal-oxide-semiconductor (MOS) type.

In order to reduce consumption and obtain better properties of noise filtering, capacitive coupling level shifters are also known. For example, US Patent Publication Number 2008/0088353 describes a level shifter including a switched-capacitor circuit. This level shifter is hence of a synchronous type, since switching of the switched-capacitor circuit is driven by a signal different from the signal to be shifted. The level shifter described in US Patent Publication Number 2008/0088353 is hence characterized by a certain circuit complexity.

In addition, U.S. Pat. No. 7,777,549 describes a level shifter including a pair of capacitors and an inverter circuit, which are connected so as to perform a conversion of an input signal into a differential signal. This level shifter is hence characterized by good properties of filtering of the input signal. However, on account of the level shift, it is possible for the inverter circuit not to have a sufficient sensitivity for detecting transitions of the input signal from a first logic value to a second logic value.

BRIEF SUMMARY

According to the present disclosure, an electronic level shifter circuit is provided that includes a first transmitter circuit configured to be coupled to a first voltage and to generate an electrical communication signal; a capacitive coupling stage configured to operate in a first operating condition during which the capacitive coupling stage is configured to receive the electrical communication signal and is configured to supply a corresponding filtered signal; a first receiver circuit configured to be coupled to a second voltage, differing from said first voltage, the first receiver circuit being configured to receive the filtered signal. The first receiver circuit configured to include an electronic threshold device having an input terminal and an output terminal and configured to switch an electrical quantity on said output terminal between a first value and a second value as a function of corresponding transitions through a threshold of a first intermediate signal present on said input terminal, to generate a second intermediate signal; and a biasing circuit, coupled to said capacitive coupling stage, to said input terminal, and to said output terminal, and configured to generate said first intermediate signal, the first intermediate signal including a d.c. component, which is a function of the second intermediate signal and a variable component, which is a function of said filtered signal.

BRIEF DESCRIPTION OF THE SEVERAL VIEWS OF THE DRAWINGS

For a better understanding of the present disclosure, preferred embodiments are now described, purely by way of non-limiting examples, with reference to the attached drawings, wherein.

DETAILED DESCRIPTION

Figure 1:
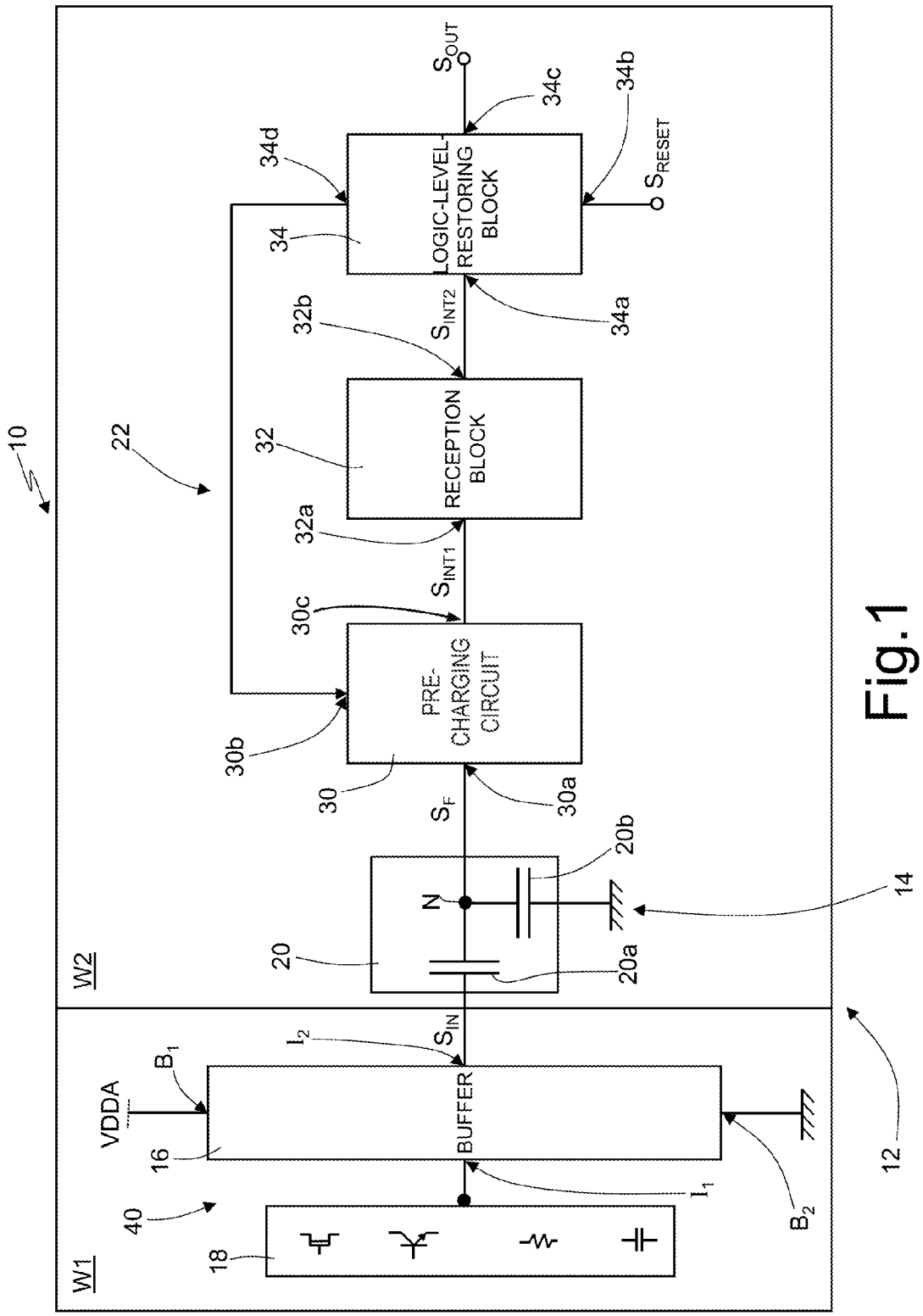
FIG. 1 shows a block diagram of the present electronic level shifter circuit.

FIG. 1 shows an integrated electronic circuit 10, which is formed within a first die, which in turn comprises a first well W1 and a second well W2, which are hence formed starting from one and the same semiconductor substrate (not shown). As described hereinafter, the first and second wells W1, W2 are designed to be connected to different voltages, which hence define two different voltage domains.

Formed in the integrated electronic circuit 10 is an electronic level shifter circuit 14, which is referred to hereinafter, for brevity, as level shifter 14.

In greater detail, within the first well W1, a buffer circuit 16 is formed, which is electrically connected to a first supply voltage VDDA and to ground by means of a first supply terminal B1 and a second supply terminal B2, respectively. In addition, the buffer circuit 16 has an input terminal $I_1$ and an output terminal $I_2$. The input terminal $I_1$ is connected to a first electronic circuitry 18, formed in the first well W1. Purely by way of example, the buffer circuit 16 may be formed by a pair of inverters cascaded to one another.

Inside the second well W2, a capacitive divider 20 and a first receiver circuit 22 are formed.

In the example shown in FIG. 1, the capacitive divider 20 comprises a first capacitor 20a and a second capacitor 20b. The first capacitor 20a has a first terminal connected to the output terminal $I_2$ of the buffer circuit 16, and a second terminal connected to a first terminal of the second capacitor 20b in such a way as to define a first node N; the second terminal of the second capacitor 20b is connected to ground.

The first receiver circuit 22 is connected to a second supply voltage VDDB (connection not shown) and comprises a pre-charging circuit 30, a reception block 32, and a logic-level-restoring block 34, which are cascaded to one another.

In detail, the pre-charging circuit 30 has a first input terminal 30a and a second input terminal 30b, and an output terminal 30c; the reception block 32 has an input terminal 32a and an output terminal 32b; and the logic-level-restoring block 34, which will be referred to hereinafter, for brevity, as restoring block 34, has a first input terminal 34a and a second input terminal 34b, and a first output terminal 34c and a second output terminal 34d.

The first input terminal 30a and the output terminal 30c of the pre-charging circuit 30 are, respectively, connected to the first node N and to the input terminal 32a of the reception block 32, the output terminal 32b of which is connected to the first input terminal 34a of the restoring block 34.

The second input terminal 34b of the restoring block 34 is designed to receive an initialization signal $S_{RESET}$, which performs the function of initializing an output signal $S_{OUT}$, present on the first output terminal 34c of the restoring block 34, to a pre-defined value (for example, a low or high logic value).

Finally, the second output terminal 34d of the restoring block 34 is connected to the second input terminal 30b of the pre-charging circuit 30.

Operatively, if we designate by $S_{IN}$ an input signal, which is present on the output terminal $I_2$ of the buffer circuit 16 and is of a (for example) digital type, and if we designate by $S_F$ a corresponding filtered signal, present on the first node N, the pre-charging circuit 30 performs the function of biasing the reception block 32 in order to enable correct detection of the filtered signal $S_F$ by the reception block 32 itself. More in particular, as described in greater detail hereinafter, the pre-charging circuit 30 performs the function of generating on its own output terminal 30c, and hence on the input terminal 32a of the reception block 32, a first intermediate signal $S_{INT1}$, which can be received and correctly interpreted by the reception block 32.

The reception block 32 hence receives the first intermediate signal $S_{INT1}$, detects the logic values associated thereto, and supplies on its own output terminal 32b a second intermediate signal $S_{INT2}$, amplified with respect to the first intermediate signal $S_{INT1}$.

The restoring block 34 performs the function of shaping the waveform of the second intermediate signal $S_{INT2}$, for example rendering the rising and falling edges steeper, and thus generating the output signal $S_{OUT}$ on its own first output terminal 34c.

Figure 2:
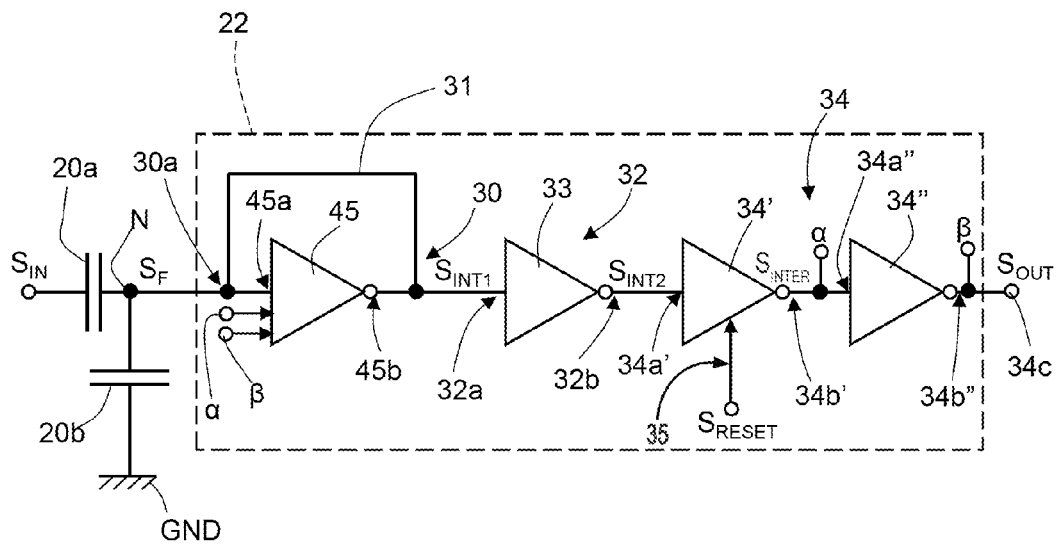
FIG. 2 shows a circuit diagram of a portion of the electronic level shifter circuit shown in FIG. 1.

Purely by way of example, FIG. 2 shows a circuit representation of an embodiment of the block diagram of FIG. 1.

According to the embodiment illustrated in FIG. 2, the pre-charging circuit 30 includes a pre-charging device 45, such as, for example, an inverter of a CMOS type, configured for receiving on a first input 45a of its own the filtered signal $S_F$ and for generating on an output terminal 45b of its own the first intermediate signal $S_{INT1}$.

The first input 45a of the pre-charging device 45 is hence connected to the first node N. In addition, the first input 45a of the pre-charging device 45 is connected to the output terminal 45b of the pre-charging device 45 itself, for example, by means of a short circuit 31. In practice, the output terminal 45b of the pre-charging device 45 defines the output terminal 30c of the pre-charging circuit 30.

The reception block 32 comprises a threshold device 33, such as, for example, a first inverter of a CMOS type. In detail, the threshold device 33 has an input terminal, which defines the input terminal 32a of the reception block 32 and is connected to the output terminal 45b of the pre-charging device 45 so as to receive the first intermediate signal $S_{INT1}$. The threshold device 33 moreover has an output terminal, which defines the output terminal 32b of the reception block 32.

In use, the threshold device 33 generates on the output terminal 32b the second intermediate signal $S_{INT2}$, which depends not only upon the first intermediate signal $S_{INT1}$ but also upon the inversion threshold of the threshold device 33.

The restoring block 34 comprises one or more voltage-inverter devices, cascaded to one another.

For example, in the embodiment shown in FIG. 2, the restoring block 34 comprises a second inverter 34' and a third inverter 34". The second inverter 34' has an input terminal 34a', which is connected to the output terminal 32b of the threshold device 33.

Consequently, the second inverter 34' is designed to receive at input the second intermediate signal $S_{INT2}$ and generate, on a respective output terminal 34b', a third intermediate signal $S_{INTER}$, equal to the logic negation of the second intermediate signal $S_{INT2}$ and having rising and falling edges that are steeper than the latter. The second inverter 34' moreover has a control terminal 35, designed to receive the initialization signal $S_{RESET}$, which, if need be, forces the third intermediate signal $S_{INTER}$ to a pre-set logic value.

The third inverter 34" has an input terminal 34a", which is connected to the output terminal 34b' of the second inverter 34'. Consequently, the third inverter 34" is designed to receive at input the third intermediate signal $S_{INTER}$ and to generate, on a respective output terminal 34b", the output signal $S_{OUT}$, which is equal to the logic negation of the third intermediate signal $S_{INTER}$ and has rising and falling edges steeper than the latter.

The signals generated at output by the second and third inverters 34' and 34", i.e., the third intermediate signal $S_{INTER}$ and the output signal $S_{OUT}$, are used for controlling operation of the reception block 32, as will be explained in greater detail hereinafter with reference to FIGS. 3 and 4. For this purpose, the pre-charging device 45 comprises a second input terminal α and a third input terminal β, which are connected, respectively, to the output terminal 34b' of the second inverter 34' and to the output terminal 34b" of the third inverter 34".

This being said, the first buffer circuit 16 and the first electronic circuitry 18 form a first transmitter circuit 40, which is coupled to the first receiver circuit 22 through the capacitive divider 20.

If we assume, for example, that the first supply voltage VDDA is higher than the second supply voltage VDDB, i.e., if we assume that the first transmitter circuit 40 belongs to a voltage domain that is more extensive than the domain of the first receiver circuit 22, what is described hereinafter takes place.

In detail, on account of the presence of the capacitive divider 20, the filtered signal $S_F$ has a reduced dynamics with respect to the dynamics of the input signal $S_{IN}$.

This reduction is not predictable exactly, since the coupling of the first transmitter circuit 40 and of the first receiver circuit 22 takes place not only through the capacitive divider 20, but also through inevitable parasitic capacitors, such as, for example, the capacitor (not shown) that is created between the output terminal $I_2$ of the buffer circuit 16 and ground, it not being possible to determine exactly the value of the capacitance introduced by these parasitic capacitors.

In general, it is, for example, possible for the dynamics of the filtered signal $S_F$ to be reduced to such a point as not to enable, in the absence of the pre-charging circuit 30, correct interpretation of the filtered signal $S_F$ by the reception block 32, whereby "correct interpretation" is meant the fact that each edge (alternatively, rising or falling edge) of the filtered signal $S_F$, which corresponds to a corresponding edge of the input signal $S_{IN}$, causes a corresponding switching of the threshold device 33.

In other words, it is possible for the maximum voltage of the filtered signal $S_F$ to be lower than the inversion threshold of the threshold device 33. Consequently, the pre-charging circuit 30 performs the function of maintaining the voltage level on its own output terminal 45b at a value such as to enable proper operation of the threshold device 33.

Figures 3, 4:
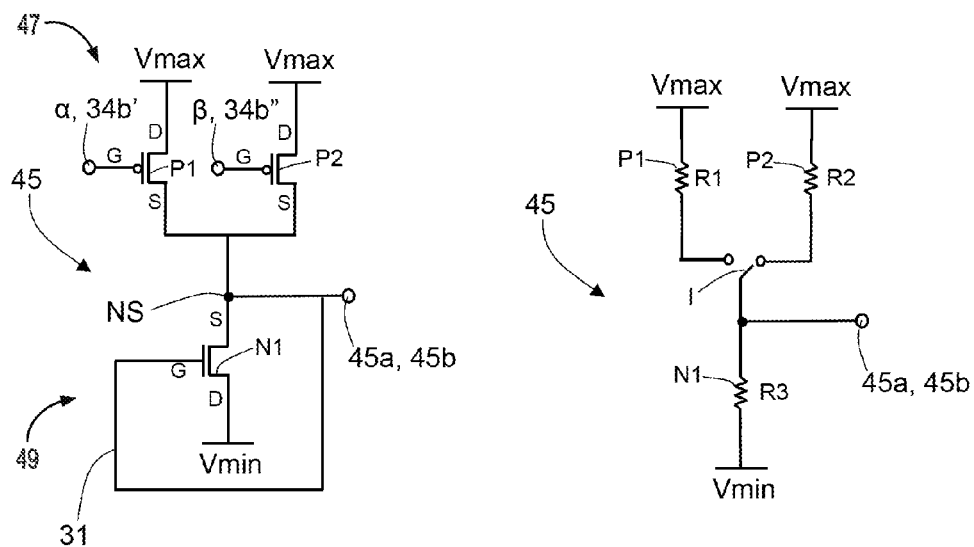
FIG. 3 shows a circuit diagram of a component of the portion of the electronic level shifter circuit shown in FIG. 2.
FIG. 4 shows an equivalent electrical circuit of the component shown in FIG. 3.

More in particular, FIG. 3 shows an example of the pre-charging device 45, which includes a first branch 47 and a second branch 49.

The first branch is formed by a first transistor P1 and a second transistor P2 of a PMOS type, connected in parallel to one another. More in particular, each of the first and second transistors P1 and P2 has the respective drain terminal connected to a first biasing voltage Vmax, for example equal to the second supply voltage VDDB. Moreover, the source terminals of the first and second transistors P1, P2 are connected to one another so as to define a second node NS. In addition, the gate terminals of the first and second transistors P1, P2 define, respectively, the second and third input terminals α, β of the pre-charging device 45 and are hence connected, respectively, to the output terminal 34b' of the second inverter 34' and to the output terminal 34b" of the third inverter 34".

The second branch of the pre-charging device 45 includes a third transistor N1, of an NMOS type. The drain terminal of the third transistor N1 is connected to a second biasing voltage Vmin, for example, equal to ground, whilst the gate terminal and the source terminal of the third transistor N1 are both connected to the second node NS, which defines the first input terminal 45a and the output terminal 45b of the pre-charging device 45.

In use, since the output terminal 34b' of the second inverter 34' and the output terminal 34b" of the third inverter 34" are at voltages associated to opposite logic values, the first and second transistors P1, P2 are driven in conduction and inhibition in an alternating way with respect to one another. As illustrated schematically in FIG. 4, driving into conduction and inhibition of the first and second transistors P1 and P2 is electrically equivalent to driving of a switch I. In addition, the first, second, and third transistors P1, P2, N1 behave electrically, respectively, as a first equivalent resistor, a second equivalent resistor, and a third equivalent resistor, which have resistances respectively equal to R1, R2 and R3. Consequently, the first, second and third transistors P1, P2, N1 form a resistive divider, with the result that, on the output terminal 45b, the first intermediate signal $S_{INT1}$ has a d.c. component $V_L$ equal to an intermediate value between the first biasing voltage Vmax, which represents the logic value "1", and the second biasing voltage Vmin, which represents the logic value "0".

Superposed on the d.c. component is a variable component $V_V$, which is proportional to the filtered signal $S_F$.

It is hence possible to design, in a way in itself known, the resistances R1, R2, R3 in such a way that the d.c. component $V_L$ of the first intermediate signal $S_{INT1}$ is close to the inversion threshold of the reception block 32, i.e., to the inversion threshold of the threshold device 33.

In greater detail, the values of the resistances R1, R2 and R3 are chosen in such a way that, by driving the first and second transistors P1 and P2 alternatively in conduction or inhibition, the d.c. component $V_L$ assumes alternatively a value $V^+$ close, by excess, to the inversion threshold of the threshold device 33, or a value $V^-$ close, by defect, to the inversion threshold of the threshold device 33. The difference between $V^+$ and $V^-$ determines the sensitivity of the reception block 32 and may be chosen so as to optimize the sensitivity and resistance to noise of the reception block 32 itself.

Purely by way of example, in absolute value, the value $V^+$ and the value $V^-$ may differ from the inversion threshold of the threshold device 33 by 50 mV.

In practice, the pre-charging device 45 supplies on its own output terminal 45b a signal having the function of charging the input of the threshold device 33 to a voltage value such as to guarantee that the threshold device 33 operates within the so-called high-gain area, which comprises the inversion threshold; in this way, a greater sensitivity to the filtered signal $S_F$ is obtained.

In detail, the fact that, at a generic instant the first intermediate signal $S_{INT1}$ assumes the value $V^+$, or else the value $V^-$, depends upon the voltage values assumed in said instant $t_i$ by the third intermediate signal $S_{INTER}$ and by the output signal $S_{OUT}$, and hence depends upon the voltage values assumed by the input signal $S_{IN}$ in instants preceding in time the instant $t_i$.

In even greater detail, at each rising edge of the input signal $S_{IN}$, and hence at each rising edge of the filtered signal $S_F$, the pre-charging device 45 sets the d.c. component $V_L$ equal to the value $V^+$ in such a way that the next edge, which is inevitably a falling edge, can be readily detected by the threshold device 33, i.e., it causes a corresponding switching thereof. Likewise, at each falling edge of the input signal $S_{IN}$, and hence at each falling edge of the filtered signal $S_F$, the pre-charging device 45 sets the d.c. component $V_L$ equal to the value $V^-$ in such a way that the next edge, which is inevitably a rising edge, can be readily detected by the threshold device 33, i.e., it causes a corresponding switching thereof.

In other words, at a given instant the voltage value assumed by the d.c. component $V_L$ of the first intermediate signal $S_{INT1}$ depends upon the last edge—i.e., the last transition from a first logic value to a second logic value that are different from one another—that has taken place in the filtered signal $S_F$, prior to the given instant $t_i$.

In practice, the buffer circuit 16, the capacitive divider 20, and the receiver circuit 22 form the electronic level shifter circuit 14, which enables precisely generation, starting from the input signal $S_{IN}$, belonging to the first voltage domain, of the output signal $S_{OUT}$, which is logically consistent with the input signal $S_{IN}$ and belongs to the second voltage domain.

Figure 5:
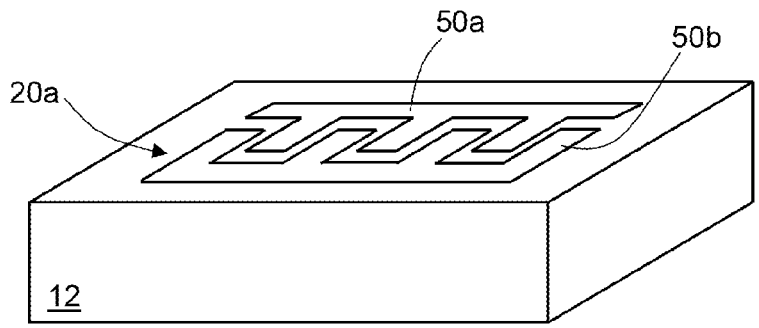
FIG. 5 is a qualitative representation of a perspective view of a die.

This being said, at least one between the first and second capacitors 20a, 20b of the capacitive divider 20 may advantageously be of the comb-fingered type. For example, assuming that the first capacitor 20a is of a comb-fingered type, it is formed, as shown in FIG. 5, by a first conductive element 50a and a second conductive element 50b, which are arranged on a surface of the first die 12, are substantially two-dimensional, i.e., have a negligible thickness, and are comb-fingered to one another.

According to a different embodiment, the second capacitor 20b is absent. This embodiment is hence particularly suited to the case which the voltage domain of the transmitter circuit 40 is lower than the voltage domain of the receiver circuit 22. In fact, in this way, the reduction of dynamics of the filtered signal $S_F$ with respect to the input signal $S_{IN}$ is limited.

Figure 6:
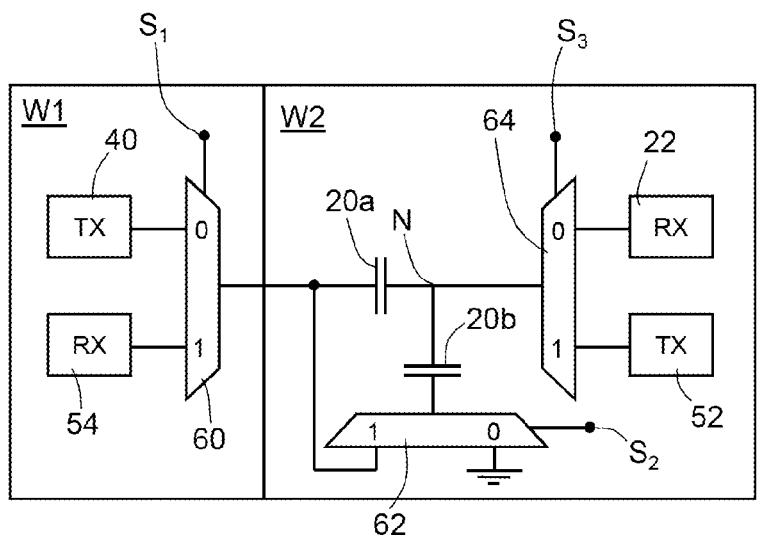
FIG. 6 shows a block diagram of a different embodiment of the present electronic level shifter circuit.

According to a further embodiment, the level shifter 14 is designed to enable a communication of a bidirectional type, as shown in FIG. 6.

In detail, the integrated electronic circuit 10 further comprises a second transmitter circuit 52 and a second receiver circuit 54, which are, respectively, formed within the second and first wells W2, W1, and are hence connected, respectively, to the second and first supply voltages VDDB, VDDA. The second transmitter circuit 52 may be equal to the first transmitter circuit 40, whilst the second receiver circuit 54 may be equal to the first receiver circuit 22.

In addition, the integrated electronic circuit 10 comprises a first multiplexer 60, a second multiplexer 62, and a third multiplexer 64, each of which has a pair of input terminals, a selection terminal, and an output terminal.

The first multiplexer 60 may be formed within the first well W1. Moreover, the input terminals of the first multiplexer 60 are, respectively, connected to the output terminal $I_2$ of the buffer circuit 16 of the first transmitter circuit 40 and to the first input terminal of the pre-charging circuit of the second receiver circuit 54.

The second multiplexer 62, which is formed, for example, in the second well W2, has its own input terminals connected, respectively, to the output terminal of the first multiplexer 60 and to ground. Moreover, the second capacitor 20b is connected between the first node N and the output terminal of the second multiplexer 62.

The third multiplexer 64 is formed, for example, in the second well W2. In addition, the input terminals of the third multiplexer 64 are, respectively, connected to the first input terminal 30a of the pre-charging circuit 30 of the first receiver circuit 22 and to the output terminal of the buffer circuit of the second transmitter circuit 52. The output terminal of the third multiplexer 64 is connected to the first node N.

The selection terminals of the first, second, and third multiplexers 60-64, designated, respectively, by $S_1$, $S_2$ and $S_3$, are connected to corresponding electronic selection circuits in themselves known (not shown).

In this way, by controlling in a way in itself known the first, second, and third multiplexers 60-64, it is possible to transmit a communication signal from the first well W1 to the second well W2, or vice versa, setting in (capacitive) connection the first transmitter 40 and the first receiver 22, or else the second transmitter 52 and the second receiver 54. In addition, in the case where the first transmitter 40 and the first receiver 22 are set in connection, the capacitive divider 20 is still present between them. Instead, in the case where the second transmitter 52 and the second receiver 54 are set in connection, they are coupled by the parallel of the first capacitor 20a and of the second capacitor 20b.

Figure 7:
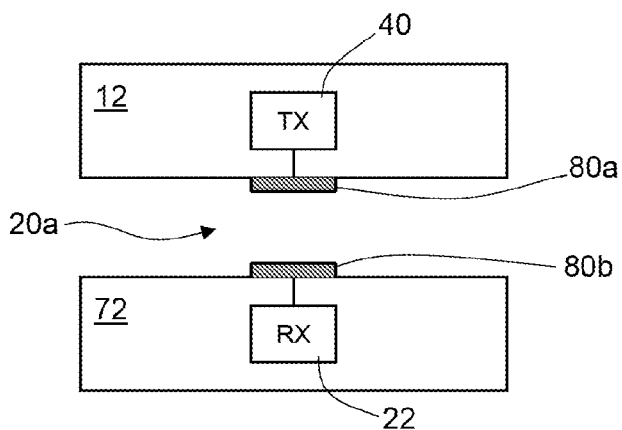
FIG. 7 shows a block diagram of an electronic device including a pair of pads.

As shown in FIG. 7 with reference, by way of example, to the case where the second transmitter and the second receiver are not present, it is likewise possible for the first transmitter 40 and the first receiver 22 to be formed, respectively, in the first die 12 and in a second die 72. In this case, the second capacitor 20b (not shown in FIG. 7) may be formed within the second die 72, whilst the first capacitor 20a may be formed, for example, by a first pad 80a and a second pad 80b, which are arranged on corresponding surfaces of the first die 12 and of the second die 72, respectively, so as to face one another.

Figure 8:
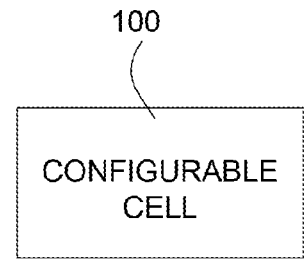
FIG. 8 shows in a symbolic way a configurable cell.

It is moreover possible for the integrated electronic circuit 10, and hence also for the level shifter 14, to be implemented using so-called configurable logic cells. In particular, it is possible for a number of components of the integrated electronic circuit 10 to be formed in one or more cells that are the same as a configurable cell 100 (FIG. 8), which is, for example, of the type described in U.S. Pat. No. 7,965,107. Purely by way of example, one or more transistors from the first, second, and third transistors P1, P2 and N1 of the pre-charging device 45 may be formed in one and the same configurable cell. Likewise, each one of the first, second, and third inverters 33, 34', 34" may be formed in a corresponding configurable cell.

The advantages of the present electronic level shifter circuit emerge clearly from the foregoing description. In particular, it enables exploitation of the benefits deriving from capacitive coupling, such as, for example, the possibility of filtering the input signal $S_{IN}$ and the reduction of consumption, and at the same time operation of the reception block 32 in the proximity of its own threshold voltage so as to optimize the sensitivity thereof with respect to the transitions of the filtered signal $S_F$. In addition, by appropriately choosing the values $V^+$ and V, it is possible to optimize the resilience to noise of the reception block 32 itself. In addition, the present electronic level shifter circuit is particularly suitable for applications of the so-called "ultra-low power" type.

One or more level shifters of the type described may also be provided in a portion of a so-called application specific integrated circuit (ASIC), and in particular in a portion that in itself would not be used for the purposes for which the ASIC itself is designed. This portion may hence be a so-called peripheral portion of the ASIC so that there is no need to modify the remaining electronic circuitry of the ASIC. In this way, if need be, it is possible to connect these one or more level shifters to corresponding pads of the so-called "input/output (I/O) pads" of the ASIC. By so doing, it is possible to use input/output pads originally provided for reception of signals belonging, for example, to a low voltage domain, for receiving, instead, signals belonging to a high voltage domain, if the need were to arise.

Finally, it is clear that modifications and variations may be made to the disclosure described and illustrated herein without thereby departing from the sphere of protection of the present disclosure. For example, the pre-charging device 45 could be formed by a resistive divider.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate having a first well and a second well;
   an asynchronous electronic level shifter circuit that includes:
      a first transmitter circuit configured to be coupled to a first voltage and to generate a first electrical communication signal, the first transmitter circuit being in the first well;
      a second transmitter circuit configured to be coupled to a second voltage, that is different from the first voltage, and to generate a second electrical communication signal, the second transmitter circuit being in the second well;
      a first receiver circuit configured to be coupled to the second voltage, the first receiver circuit being in the second well; and
      a second receiver circuit configured to be coupled to the first voltage, the second receiver circuit being in the first well;
      a capacitive coupling stage configured to operate in a first operating condition, during which the capacitive coupling stage is configured to receive the first electrical communication signal and to supply a first filtered signal to said first receiver circuit, and the capacitive coupling stage is configured to operate in a second operating condition, during which the capacitive coupling stage is configured to receive the second electrical communication signal and to supply a second filtered signal to said second receiver circuit.

2. The device of claim 1 wherein the first receiver circuit includes:
   an electronic threshold device having an input terminal and an output terminal and configured to switch an electrical quantity on said output terminal between a first value and a second value as a function of corresponding transitions through a threshold of a first intermediate signal present on said input terminal, to generate a second intermediate signal; and
   a biasing circuit, coupled to said capacitive coupling stage, to said input terminal, and to said output terminal, and configured to generate said first intermediate signal with a d.c. component, which is a function of the second intermediate signal and includes a variable component, which is a function of the first filtered signal.

3. The device of claim 1, further comprising a first multiplexer in the first well, the first multiplexer being coupled to the first transmitter circuit and the second receiver circuit.

4. The device of claim 3, further comprising a second multiplexer in the second well, the second multiplexer being coupled to the second transmitter circuit and the first receiver circuit.

5. The device of claim 4 wherein the capacitive coupling stage is in the second well.

6. The device of claim 5 wherein the capacitive coupling stage includes a third multiplexer in the second well.

7. A method, comprising:
   forming a first well and a second well in a substrate;
   forming an asynchronous electronic level shifter circuit in the substrate, the forming of the level shifter circuit including:
      forming a first transmitter circuit in the first well;
      coupling the first transmitter circuit to a first voltage, the first transmitter circuit configured to generate a first electrical communication signal;
      forming a second transmitter circuit in the second well;
      coupling the second transmitter circuit to a second voltage, that is different from the first voltage, the second transmitter being configured to generate a second electrical communication signal;
      forming a first receiver circuit in the second well;
      coupling the first receiver to the second voltage; and
      forming a second receiver circuit in the first well;
      coupling the second receiver circuit to the first voltage; and
      forming a capacitive coupling stage configured to operate in a first operating condition, during which the capacitive coupling stage is configured to receive the first electrical communication signal and to supply a first filtered signal to said first receiver circuit, and the capacitive coupling stage is configured to operate in a second operating condition, during which the capacitive coupling stage is configured to receive the second electrical communication signal and to supply a second filtered signal to said second receiver circuit.

8. The method of claim 7, further comprising forming a first multiplexer in the first well and coupling the first multiplexer to the first transmitter circuit and the second receiver circuit.

9. The method of claim 8, further comprising forming a second multiplexer in the second well and coupling the second multiplexer to the second transmitter circuit and the first receiver circuit.

10. The method of claim 9, further comprising forming the capacitive coupling stage in the second well.

11. A method, comprising:
    coupling a first voltage to a first transmitter circuit of an asynchronous electronic level shifter circuit, the first transmitter circuit being in a first well of a substrate that also includes a second well;
    coupling a second voltage, different from the first voltage, to a second transmitter circuit of the asynchronous electronic level shifter circuit, the second transmitter circuit being in the second well;
    coupling the second voltage to a first receiver circuit of the asynchronous electronic level shifter circuit, the first receiver circuit being in the second well; and
    coupling the first voltage to a second receiver circuit of the asynchronous electronic level shifter circuit, the second receiver circuit being in the first well;
    generating, by the first transmitter circuit, a first electrical communication signal;
    generating, by the second transmitter circuit, a second electrical communication signal;

operating a capacitive coupling stage of the asynchronous electronic level shifter circuit in a first operating condition, during which the capacitive coupling stage receives the first electrical communication signal and supplies a first filtered signal to the first receiver circuit; and operating the capacitive coupling stage in a second operating condition, during which the capacitive coupling stage receives the second electrical communication signal and supplies a second filtered signal to the second receiver circuit.

12. The method of claim 11, comprising:

switching an electrical quantity, on an output terminal of an electronic threshold device of the first receiver circuit, between a first value and a second value as a function of corresponding transitions through a threshold of a first intermediate signal present on an input terminal of the electronic threshold device, thereby generating a second intermediate signal; and generating, by a biasing circuit, said first intermediate signal with a d.c. component, which is a function of the second intermediate signal and includes a variable component, which is a function of the first filtered signal, the biasing circuit being coupled to said capacitive coupling stage, to said input terminal, and to said output terminal.

13. The method of claim 11, comprising:

transmitting the first electrical communication signal to the capacitive coupling stage through a first multiplexer in the first well; and transmitting the second filtered signal from the capacitive coupling stage to the second receiver circuit through the first multiplexer.

14. The method of claim 13, comprising:

transmitting the second electrical communication signal to the capacitive coupling stage through a second multiplexer in the second well; and transmitting the first filtered signal from the capacitive coupling stage to the first receiver circuit through the second multiplexer.

15. The method of claim 14, comprising:

selectively coupling a terminal of the capacitive coupling stage to an output of the first multiplexer through a third multiplexer in the second well; and selectively coupling the terminal of the capacitive coupling stage to ground through the third multiplexer.

* * * * *